United States Patent
Lukacs, III

(10) Patent No.: US 6,756,469 B2
(45) Date of Patent: Jun. 29, 2004

(54) POLYSILAZANE-MODIFIED POLYAMINE HARDENERS FOR EPOXY RESINS

(75) Inventor: Alexander Lukacs, III, Wayne, PA (US)

(73) Assignee: Kion Corporation, Huntingdon Valley, PA (US)

( * ) Notice: Subject to any disclaimer, the term of this patent is extended or adjusted under 35 U.S.C. 154(b) by 34 days.

(21) Appl. No.: 10/195,782

(22) Filed: Jul. 15, 2002

(65) Prior Publication Data

US 2003/0045635 A1 Mar. 6, 2003

Related U.S. Application Data

(60) Provisional application No. 60/306,373, filed on Jul. 18, 2001.

(51) Int. Cl.$^7$ .................. C08G 59/50; C08G 59/40; C08G 77/62
(52) U.S. Cl. .................. 528/93; 528/28; 528/33; 528/38; 525/474; 525/476; 525/523
(58) Field of Search .................. 156/329, 330; 428/446, 413; 525/474, 476, 523; 528/28, 33, 38, 93

(56) References Cited

U.S. PATENT DOCUMENTS

| 4,975,512 A | | 12/1990 | Funayama et al. ............ 528/28 |
| 5,008,422 A | * | 4/1991 | Blum et al. ................. 556/412 |
| 5,089,552 A | | 2/1992 | Myers ........................ 524/404 |
| 5,130,402 A | * | 7/1992 | Akiyama et al. ............. 528/45 |
| 5,198,519 A | | 3/1993 | Mosher et al. ................ 528/28 |
| 5,616,650 A | | 4/1997 | Becker et al. ............... 525/102 |
| 5,990,024 A | * | 11/1999 | Blum et al. .................. 501/88 |
| 6,310,168 B1 | | 10/2001 | Shimizu et al. ............... 528/28 |

OTHER PUBLICATIONS

Vinogradova (SU 528323 A–Derwent abstract) Dec. 1975.*

* cited by examiner

*Primary Examiner*—Jeffrey B. Robertson
(74) *Attorney, Agent, or Firm*—Howard M. Ellis

(57) ABSTRACT

Novel polysilazane-modified polyamine hardeners for epoxy resins, such classes as glycidyl ether epoxy resins and novolac epoxy resins, including reaction mixtures, compositions and reaction products comprising such hardeners, impart enhanced high temperature properties, higher char yields and better adhesion properties to the cured epoxy resins relative to the same epoxy resins cured using unmodified polyamine hardeners.

34 Claims, No Drawings

POLYSILAZANE-MODIFIED POLYAMINE HARDENERS FOR EPOXY RESINS

CROSS-REFERENCE TO RELATED APPLICATION

This application claims the benefit of U.S. Provisional application 60/306,373, filed Jul. 18, 2001.

TECHNICAL FIELD

This invention generally relates to improved hardeners or curing agents for thermosetting resins, and more specifically to a novel class of polysilazane-modified polyamine hardeners for epoxy resins, useful compositions, reaction mixtures and reaction products prepared therewith.

BACKGROUND OF THE INVENTION

Epoxy resin can be generally defined as containing a molecule with one or more epoxide, oxirane or ethoxylene groups. The resins may be classified as thermosetting polymers, and are widely used as adhesives, high performance coatings, potting and encapsulating materials, to name but a few applications. Epoxy resins possess excellent electrical properties, low shrinkage, good adhesion to many metals, resistance to moisture, and resistance to thermal and mechanical shock. Of the two main categories of epoxy resins, the glycidyl ether epoxy resins, such as the diglycidyl ether of bisphenol-A and the novolac epoxy resins are among the most commonly used epoxies.

Typical commercial epoxy resins of the diglycidyl ether of bisphenol-A type are synthesized by reacting bisphenol-A with epichlorohydrin in the presence of a basic catalyst. The properties of the resin will depend on the number of polymer repeat units, commonly referred to as the degree of polymerization, which is dependent on the stoichiometry of the synthesis reaction. In many commercial products of this type the repeating units can generally range from about 1 to about 25.

The novolac epoxy resins are glycidyl ethers of phenolic novolac resins. Phenols are reacted in excess, with formaldehyde in the presence of acidic catalyst to produce the phenolic novolac resin. Novolac epoxy resins are synthesized by reacting phenolic novolac resin with epichlorohydrin in the presence of sodium hydroxide catalyst.

The multiple epoxide groups usually present in novolac epoxy resins allow these resins to achieve high cross-link densities in formulating molding compounds for microelectronics packaging as a result of their superior performance at elevated temperatures, excellent moldability, and mechanical properties, superior electrical properties, and heat and humidity resistance.

In order to convert such epoxy resins into hard, infusible, and rigid materials without the use of a catalyst, it is necessary to cure the resins with hardener. The curing process is a chemical reaction characterized by the epoxide groups in the epoxy resin reacting with the curing agent, or hardener to form highly crosslinked, three-dimensional networks.

Amines are the most commonly used curing or hardening agents for epoxy resins. Primary and secondary amines are especially highly reactive with epoxies. Tertiary amines are also useful in catalyzing or accelerating the curing reaction.

To-date, the modification of nucleophilic, organic polyamines with polysilazanes for use as epoxy resin hardeners has not been demonstrated. Since the bulk of amine hardeners used to cure epoxy resins at room temperature comprise polyamines, the use of such polysilazane-modified polyamines to cure epoxy resins would have widespread utility.

Polysilazanes are polymers which contain repeat units wherein silicon and nitrogen atoms are bonded in alternating sequence. Polysilazanes all possess reactive Si—N functionality which enables co-reaction with various electrophilic organic materials, such as epoxy resins. The direct reaction of polysilazane with epoxy resins is known.

Heretofore, in reactions of a polysilazane with an epoxy resin as taught, for example, in U.S. Pat. No. 5,616,650, the methods were performed under conditions wherein the silicon-nitrogen bond of the polysilazane reacted directly with the oxirane groups of the epoxy resin to form the cured polymer. Heat, however, typically in excess of 100° C., was required to perform the reactions. Methods for incorporating polysilazanes into cured epoxy resins at room temperature, however, have not been described. By forming the reaction product of the immediate invention, the organic amine residues of the reaction product can be used to react directly with the oxirane rings of the epoxy resin at room temperature to effect epoxy resin cure. At these lower temperatures the silicon-nitrogen bonds of the polysilazanes, which are incorporated into the reaction product of the polyamine and the polysilazane, do not react with the oxirane rings of the epoxy resin. Instead, the organic amine groups of the reaction product initiate and propagate the cure. These novel cure reactions lead to hybrid polymer systems wherein the cured epoxy resins display increased thermal stability with retention of mechanical properties at higher temperatures, higher char yields, and better adhesion to inorganic fillers and substrates than epoxy resins cured with conventional polyamines.

Silazanes have also been shown to react with nucleophilic organic materials such as alcohols, amines and phenols.

For example, U.S. Pat. No. 5,089,552, to Myers teaches the in-situ polymerization of various silicon-nitrogen containing cyclic silazane monomers with phenolic resins to generate thermally stable high char yield polysilazoxane-modified phenolic resins. The reaction of polysilazanes with OH groups of polyphenols is thus known, but not the reaction of polysilazanes with the —NH$_2$ or NRH groups of polyamines.

U.S. Pat. No. 6,310,168 B1 to Shimizu et al teaches the reaction of various polysilazanes with amine residue-containing hydroxyl compounds to generate amine-appended polysilazanes in which the amine residue-containing hydroxyl compound reacts with the polysilazane at the hydroxyl group to generate a product which comprises a silicon-oxygen bond. The reaction with the less reactive —NH$_2$ or —NRH groups does not occur.

U.S. Pat. No. 4,975,512, on the other hand, teaches the reaction of various polysilazanes with monomeric primary and secondary amines or hydrazines to form "reformed" polysilazanes. The reaction disclosed involves compounds of the formula:

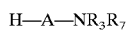

wherein A is a direct bond or —NR$_4$— where R$_4$ is hydrogen, an alkyl, an alkenyl, a cycloalkyl, an aryl, an aralkyl or a heterocyclic group, and R$_3$ and R$_7$, are independently selected from hydrogen, an alkyl, an alkenyl, a cycloalkyl, an aryl, an aralkyl or a heterocyclic group. Thus, when A is a direct bond, the compound is either ammonia, or a simple primary or secondary amine comprising a single reactive nitrogen group. When A is a hydrocarbyl or heterocyclic group as defined, the compound is either a primary, secondary, or tertiary amine also comprising a single reactive nitrogen group. When A is —NR$_4$— a hydrazine compound results, which is neither a simple monomeric amine, nor a polyamine. The reaction requires polysilazane comprising Si—H bonds, is performed in a solvent, and is said to proceed by dehydrogenative polycondensation with the in situ production of hydrogen gas.

U.S. Pat. No. 5,198,519 teaches the preparation of polysilazanes by reacting (A) with (B), wherein (A) is one or more silicon amide monomers represented by the general formula:

wherein each R is independently selected from hydrogen or a hydrocarbon group, each R$^1$ is a saturated hydrocarbon group, a is an integer from 2 to 4, b is an integer from 0 to 2, and the sum of a and b equals 4, and (B) is one or more polyamines. (A) is never a polysilazane.

Although silazanes are formally disilylamines, their reactivity with epoxies does not parallel that of organic amines. Silazanes are not as basic as organic amines, and the reactivity of silazane-based polymers with epoxy resins stems primarily from the polarity of the Si—N bond and its oxophilic nature, allowing it to react with a variety of epoxy resins by Si—N bond addition across epoxy resin oxirane groups at elevated temperature, as taught in U.S. Pat. Nos. 5,616,650; 5,741,878; 5,637,641; 5,767,218; 5,807,954; 5,733,997; and 5,750,628. Typically, however, the reaction of the silicon-nitrogen bond of a polysilazane with an epoxy resin is rather sluggish, and high temperatures are normally required to effect full cure. Also, depending on the exact epoxy resin involved, phase separation of the resin with the polysilazane may complicate the reaction and the formation of the desired, cured hybrid epoxy resin.

Side reactions can also complicate the reaction of a polysilazane with an epoxy resin. This inventor found the reactivity of the Si—N bond with active hydroxyl groups also tends to create an inherent problem when silazane-based polymers are used as hardeners for epoxy resins. Oxirane ring opening in such reactions generates free hydroxyl groups which react with Si—N bonds to form Si—O—C bonds in the reaction mixture. In the process of this reaction, terminal ≡Si—NH$_2$ groups are formed within the polysilazane. Such groups can then further react with either ≡Si—NH—Si≡ groups or other hydroxyl groups present in the reaction mixture to generate free ammonia, which is evolved and compromises the cure.

SUMMARY OF THE INVENTION

Surprisingly, it was discovered that when the polysilazane-modified polyamine hardeners of this invention are employed to cure epoxy resins, the resulting cured resins exhibit enhanced high temperatures properties, higher char yields, and better adhesion to a variety of materials relative to the same epoxy resins which are cured using the corresponding unmodified polyamine hardener.

It is therefore a principal object of this invention to provide for a novel class of polysilazane-modified epoxy resin hardeners, and more particularly, epoxy hardening agents derived from the reaction of a polyamine and a polysilazane wherein the reaction products are characterized by at least one newly formed silicon-nitrogen bond. Included within the meaning of the term "polysilazane" as appearing in this specification and claims are silazane oligomers and polysilazanes having higher molecular weights, as well as classes of polymers known as poly-siloxazanes, poly(urea)silazanes, poly(thio)ureasilazanes and poly(boro) silazanes.

It is yet a further object of the invention to provide for reaction mixtures comprising a polyamine and the polysilazane wherein the polyamine has at least two amine groups, and more preferably, greater than two amine groups, and which are selected from primary and secondary amines. Optionally, polyamine can also include tertiary amines which can act to accelerate the cure.

A still further object of this invention is to provide compositions of matter that are useful in curing epoxy type resins comprising the foregoing polysilazane-modified polyamines. Also included, are the reaction mixtures and their corresponding reaction products, wherein the reaction mixtures comprise the polysilazane-modified polyamine hardening agents and epoxy resins generally, such as diglycidyl ether of Bisphenol-A (DGEBA), as well as novolac epoxy type resins, like epoxy cresol novolac and epoxy phenol novolac, to name but a few.

The instant invention is intended to also encompass epoxy based coatings, adhesives, structural materials, and the like, prepared with the polysilazane-modified polyamine hardeners of the invention which impart the improved properties thereto, such as enhanced high temperature characteristics, improved char yields, and better adhesion.

DESCRIPTION OF THE PREFERRED EMBODIMENTS

This inventor has discovered the above-mentioned side reactions when a polysilazane is reacted directly with an epoxy resin, as well as the need to provide heat to cure an epoxy resin with a polysilazane, can be circumvented by first reacting the polysilazane with a conventional aromatic, aliphatic, or cycloaliphatic polyamine hardener for epoxy resins. Conventional polyamine hardeners for epoxy resins comprising primary or secondary amine groups can thus be heated in the presence of a polysilazane to prepare polysilazane-modified amine hardeners. Such polyamines typically have the structure:

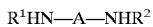

Wherein A is a multivalent organic or inorganic radical which may or may not contain additional NHR groups, and R$^1$ and R$^2$ are independently selected from the group consisting of hydrogen, an alkyl, an alkenyl, a cycloalkyl, an alkylamino, aryl, aralkyl, or alkylsilyl. Thus, R$_1$ and R$_2$ can be such groups as hydrogen, methyl, ethyl, propyl, butyl, octyl, decyl, vinyl, allyl, butenyl, octenyl, decenyl, cyclohexyl, methylcyclohexyl, methylamino, ethylamino, phenyl, tolyl, xylyl, naphthyl, benzyl, methylsilyl, ethylsilyl, propylsilyl, butylsilyl, octylsilyl, or decylsilyl. These alkyl, alkenyl, cycloalky, aryl, alkyl amino, aralkyl and alkylsilyl groups may each optionally be substituted by one or more substituents which contain heteroatoms, such as halides, like chlorine, bromine and iodine; alkoxy groups, like ethoxy, and also aryl groups, such as acetyl and propionyl.

For purposes of this invention the term "polyamine" as appearing in the specification and claims is intended to mean either a monomeric, oligomeric, or polymeric compound comprising a multiplicity (e.g., two or more) of NHR groups. Representative examples of aromatic, aliphatic, and cycloaliphatic type polyamines are ethylene diamine, diethylene triamine (DETA or DTA), triethylene tetramine (TETA) or hexamethylene tetramine, m-phenylene diamine (MPA), diamino diphenyl sulfone (DADPS or DDS), and p,p'-methylene dianiline (MDA). Thus, for purposes of this invention the term "polyamine" as appearing in the specification and claims is intended to include all three types of amines, namely primary, secondary and tertiary amines. Thus, while primary and secondary amines are required, t-amines are optional when accelerating the cure is desired.

The polysilazane moiety of the polyamine may be represented by the general formula:

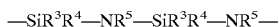

Wherein $R^3$, $R^4$ and $R^5$ are independently selected from the group consisting of hydrogen, alkyl, cycloalkyl, alkenyl, alkylamino, aryl, aralkyl, or alkylsilyl. Thus, $R^3$, $R^4$ and $R^5$ can be such groups as hydrogen, methyl, ethyl, propyl, butyl, octyl, decyl, vinyl, allyl, butenyl, octenyl, decenyl, cyclohexyl, methylcyclohexyl, methylamino, ethylamino, phenyl, tolyl, xylyl, naphthyl, benzyl, methylsilyl, ethylsilyl, propylsilyl, butylsilyl, octylsilyl, or decylsilyl. These alkyl, alkenyl, cycloalky, aryl, alkyl amino, aralkyl and alkylsilyl groups may each optionally be substituted by one or more substituents. For the practice of this invention, it will be understood that the term "polysilazane" as appearing in the specification and claims is intended as a generic expression, and includes compounds comprising a multiplicity of sequential Si—N bonds, and includes oligomers and polymers, and is not restricted to pure polysilazanes alone, but to such derivatives as polyureasilazanes, poly(thio) ureasilazanes, polyborosilazanes, and polysiloxazanes. Also included are the reaction products of the above-mentioned polymers with other inorganic or organic moieties which result in hybrid polymer compositions still comprising a multiplicity of sequential Si—N bonds, as well as pilysilazanes having different substitutents on the silicon and nitrogen atoms:

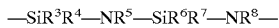

Wherein $R^3$, $R^4$ and $R^5$ are the same as above, and $R^6$, $R^7$ and $R^8$ are independently selected from the same groups as $R^3$, $R^4$, and $R^5$.

Representative polysilazanes suitable for use in the practice of this invention are, for example, those taught by Seyferth, et al in U.S. Pat. No. 4,482,669, dated Nov. 13, 1994 for "Preceramic Organosilazane Polymers"; by Burns in U.S. Pat. No. 4,774,312 on Sep. 27, 1988 for "Polydisilacyclobutasilazanes"; by Lebrun, et al in U.S. Pat. No. 4,689,252, dated Aug. 25, 1987 for "Polysilazane Composition which can Crosslink in the Presence of a Metal Compound Catalyzing a Hydrosilylation Reaction"; by Laine, et al in U.S. Pat. No. 4,612,383 on Sep. 16, 1986, for "Method of Producing Polysilazanes"; by King, III, et al in U.S. Pat. No. 4,675,424, dated Jun. 23, 1987, for "Method for Making Polysilazanes"; by Porte, et al in U.S. Pat. No. 4,722,988, dated Feb. 2, 1988, for "Organopolysilazane Composition Containing Free Radical Generators and Capable of Being Crosslinked by an Energy Input; by Schwark in U.S. Pat. No. 5,155,181, dated Oct. 13, 1992, for "(Thio)amide-Modified Silazane Polymer Composition containing a Free Radical Generator"; by Schwark in U.S. Pat. No. 5,032,649, dated Jul. 16, 1991, for "Organic Amide-Modified Polysilazane Ceramic Precursors"; by Schwark in U.S. Pat. No. 4,929,704 on May 29, 1990, for "Isocyanate- and Isothiocyanate-Modified Polysilazane Ceramic Precursors"; by Schwark in U.S. Pat. No. 5,001,090, dated Mar. 19, 1991, for "Silicon Nitride Ceramics from Isocyanate- and Isothiocyanate-Modified Polysilazanes"; by Schwark in U.S. Pat. No. 5,021,533, dated Jun. 4, 1991 for "Crosslinkable Poly(thio)ureasilazane Composition Containing a Free Radical Generator"; by Verbeek in U.S. Pat. No. 3,853,567, dated Dec. 10, 1974, for "Production of Shaped Articles of Homogeneous Mixtures of Silicon Carbide and Nitride"; by Zank in U.S. Pat. No. 5,164,344, dated Nov. 17, 1992, for "Borosilazanes as Binders for the Preparation of Sintered Silicon Carbide Monoliths"; by Blum, et al, in U.S. Pat. No. 5,990,024, dated Nov. 23, 1999, for "Dehydrocoupling treatment and hydrosilylation of silicon-containing polymers, and compounds and articles produced thereby"; by Blum, et al, in U.S. Pat. No. 5,919,572, dated Jul. 6, 1999, for "Temperature-resistant and/or nonwetting coating of cured, silicon-containing polymers"; by Blum, et al, in U.S. Pat. No. 5,405,655, dated Apr. 11, 1995, for "Temperature-resistant and/or nonwetting coatings of cured, silicon-containing polymers"; by Laine, et al, in U.S. Pat. No. 4,788,309, dated Nov. 29, 1988, for "Method of forming compounds having Si—N groups and resulting products"; by Laine, et al, in U.S. Pat. No. 4,612,383, dated Sep. 16, 1986, for "Method of producing polysilazanes", including polymers described in citations contained therein. The entire disclosures of these U.S. patents are specifically incorporated-by-reference herein.

One especially preferred group of silazanes and polysilazanes for use in the present invention are described in U.S. Pat. No. 6,329,487 to Abel, et al. The silazanes/polysilazanes of Abel et al are characterized by repeating units of silicon-nitrogen linkages having a reduced number of Si—H bonds relative to the amount of Si—H bonds contained in a halosilane starting compound used to prepare the polysilazanes. That is to say, the polysilazanes comprise a reduced amount of Si—H bonds relative to the quantity of Si—H bonds incorporated into the polysilazane from a starting compound comprising at least one Si—H bond and at least one Si-halide bond, the polysilazane further comprising a greater number of Si—N bonds and a greater nitrogen content than would otherwise be derived from complete ammonolysis of the Si-halide bonds of the starting compound. The reduction in Si—H bonds can range from about 10% to about 90% relative to the number of Si—H bonds contained in the starting compounds. Additionally, it has been found there is a proportional increase in the Si—N linkages which is essentially proportional to the reduction in Si—H bonds. The preferred polysilazanes comprise several different structures including linear, branched, ladder, and fused ring morphologies, although it is believed that these polysilazanes have fewer isolated ring structures than earlier polysilazanes.

Representative examples of polysilazanes having fused six and eight membered rings are shown in structures (1) and (2) below. These structures are merely representative of the novel polysilazanes prepared with the halosilanes employing the methods disclosed in U.S. Pat. No. 6,329,487, wherein R is independently selected from the group consisting of hydrogen, substituted or unsubstituted alkyl, substituted or unsubstituted cycloalkyl, substituted or unsubstituted alkenyl or substituted or unsubstituted aryl group, and n is 1 or greater.

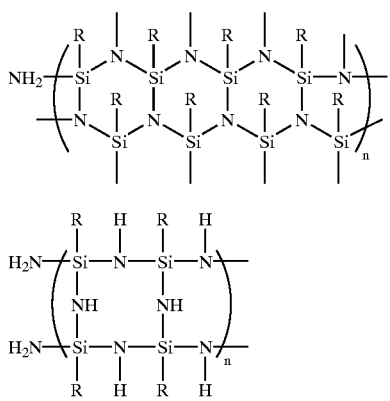

(1)

(2)

It is believed that the initial reaction leading to the formation of the ammonolysis products of Abel, et al may be represented generally by the following scheme showing a possible mechanistic route using a Si—H bond containing starting compound, such as methyldichlorosilane:

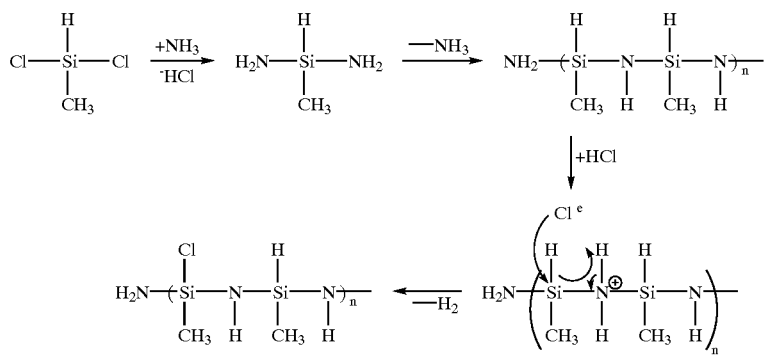

During the initial ammonolysis, the silicon-chlorine bonds undergo ammonolysis, generating a diaminosilane which is further converted into a linear molecule containing several Si—N repeat units. The linear structure is stabilized in the anhydrous liquid ammonia containing an ionized ammonium halide salt dissolved therein. This ionized and dissolved ammonium halide salt then acts as an acid catalyst which catalyzes a loss of a Si—H bond to generate a new silicon-chlorine bond on the straight chain of the polymer. The newly generated chlorosilane bond may then undergo further ammonolysis. This reaction will proceed until virtually all chlorosilicon bonds undergo ammonolysis.

The polymerization can be performed in the same reactor and at the same conditions used for ammonolysis and without isolation of the initial silazane ammonolysis product. Thus, ammonolysis and polymerization may all be occurring at the same time. Two easily-separated phases are formed and the polysilazane can be easily isolated in a relatively pure state as one of the two liquid phases.

As stated above, this preferred class of polysilazanes used as starting materials in the preparation of polysilazane-modified polyamine hardeners of this invention are disclosed in detail by U.S. Pat. No. 6,329,487, the contents of which are hereby incorporated-by-reference herein. Such polysilazanes are also commercially available under the Kion® from the Kion Corporation, New York, N.Y.

While not wishing to be bound by any precise theory, nevertheless the polysilazane-modified amine hardeners of the invention are formed by nucleophilic attack of the primary or secondary amine radicals on the polyamine at the silicon atoms of the polysilazane. As the reaction proceeds, the silicon-nitrogen bonds within the polymeric silazane structure are broken and replaced by new silicon-nitrogen bonds in which the nitrogen atoms are bonded to the polyamine structure. The reaction may be demonstrated as follows:

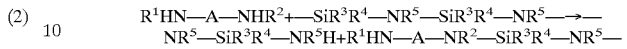

wherein the values for $R^1$ to $R^5$ are the same as provided above.

Additional reactions then occur which result in further incorporation of the polysilazane into the polyamine structure with the evolution of ammonia gas [$NH_3$] or a monomeric amine gas [$NR^5H^2$] which is more volatile than the original polyamine reactant, as shown below:

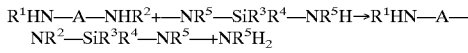

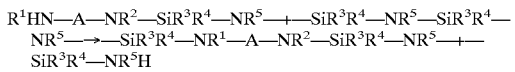

When the ratio of the number of organic amine groups in the polyamine to the number of silicon-nitrogen bonds in the polysilazane is less than about 1, polymeric silazane segments may remain in the final composition, and all of the organic primary or secondary amine groups in the polyamine will have been consumed to generate new silicon-nitrogen bonds which join the polyamine molecules to the polysilazane chain.

In a preferred embodiment, however, the ratio of the number of organic amine groups from the polyamine in the unreacted composition to the number of silicon-nitrogen bonds from the polysilazane in the unreacted composition is greater than or equal to about 1. In such cases, the polymeric nature of the polysilazane is totally disrupted, and sequential Si—N bonds may no longer exist in the final composition. Instead, the final composition, by way of example, may comprise structures of the following type:

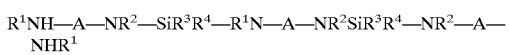

wherein A is an organic radical, and $R^1$ and $R^2$ are independently selected from the group consisting of hydrogen, an alkyl, an alkenyl, a cycloalkyl, an alkylamino, aryl, or alkylsilyl. In such cases the polysilazane is exhaustively reacted in the presence of the excess primary or secondary organic amine groups of the polyamine and the resulting structure contains only the $SiR_3R_4$ groups from the original polysilazane, but not the $NR^5$ groups which have been released as volatile ammonia or amine compounds.

Polysilazane modifications wherein the ratio of the number of organic amine groups from the polyamine in the unreacted composition to the number of silicon-nitrogen bonds from the polysilazane in the unreacted composition is from about 2 to about 6, are more preferred. Polysilazane modifications wherein the ratio of the number of organic amine groups from the polyamine in the unreacted composition to the number of silicon-nitrogen bonds from the polysilazane in the unreacted composition is from about 3 to about 5, are most preferred. In such cases, sufficient organic primary or secondary amine groups remain unreacted in the modified composition (since insufficient polysilazane structure exists to react with the total number of organic amine groups in the amount of polyamine which is reacted) in order to effect a rapid, room temperature cure of an epoxy resin.

In this method the nucleophilic, organic primary or secondary amine groups of the polyamine react with the polysilazane at the Si—N bonds of the silazane-based polymers at temperatures of about 25° C. to about 100° C. to incorporate the organosilyl segments of the polysilazane into the amine hardener. Temperatures of about 65° C. to about 90° C. are preferred, while temperatures of about 80° C. to 90° C. are most preferred. Temperatures of greater than about 100° C. are not as desirable, since volatilization of the amine component of the reaction can often occur.

When a polysilazane incorporating NH or NR groups wherein R is a lower alkyl group comprising 1 to 6 carbon atoms, pronounced foaming is observed as the reaction proceeds. This is due to volatilization of the ammonia or primary amines as gases as the reaction proceeds to incorporate the $SiR_3R_4$ moieties into the polyamine composition. When gas evolution subsides, the reaction is complete and the polysilazane-modified polyamine hardener can be then used directly to cure epoxy resins. Typically, the modified product has a higher viscosity than the unmodified polyamine, due to increased molecular weight as the various polyamine molecules are linked together by $SiR_3R_4$ groups. While this method may be used to modify polyamine, polyamide, or amine-polyamide epoxy hardeners, the modification of polyamine epoxy hardeners is preferred.

Epoxy cure is effected by adding the modified-amine hardener to the epoxy resin at proportionately higher amounts than would otherwise be recommended by the manufacturer of the unmodified amine hardener, thereby compensating for the total mass of polysilazane modifier added.

Epoxy resins suitable for the practice of this invention are well known in the art, as mentioned above. All feature a type of reactive group, referred to as "epoxide groups" or "oxirane ring". The most common, or conventional epoxy resins are obtained as the reaction product of bisphenol A with epichlorohydrin (DGEBA). By varying the proportions of these two reactants products may be obtained which vary in viscosity, molecular weight, and the number of residual epoxy groups. Variations may also be made in the product by chemical modification of the bisphenol A. Thus, additional epoxy resins include brominated versions for fire retardancy, tetraglycidyl methylene dianiline (TGMDA), polynuclear phenol epoxy (PNP), epoxy phenol novolac and epoxy cresol novolac, cycloaliphatic epoxies (CA) that are used particularly in electrical application, and hydantoin epoxies (HY), which are very compatible with aramid fibers.

The utility of the cured epoxy resins derived from the reactive, polysilazane-modified polyamines described above is varied. These epoxy resin systems possess properties characterized as hard, tough, strong and fatigue resistant. They have excellent adhesion to most materials, including metals, as well as low cure shrinkage. They have good electrical properties with a low dissipation factor. They have a good thermal and chemical (corrosion) resistance, and their resistance to salt water and weathering makes them particularly suitable for tough marine environments.

The epoxy resin compositions described above can be processed in a variety of ways. Low viscosity resins which may range, for example, from about 1 to about 10,000 centipoise, can be cast or used to impregnate reinforcements. Molding compounds can be injection-, compression-, or transfer-molded. Fast reacting systems can be used in a reaction injection molding (RIM) process.

The applications for these epoxy resin compositions fall into several categories. They can be used for protective coatings for industrial, architectural, marine, and other applications. Solvent-based, as well as solventless systems can be used for pipe, tank, drum, and can linings. Their electrical and electronic applications range from the encapsulation (potting) of small components, such as transistors or the manufacture of laminated printed circuit (PC) boards or integrated circuits (IC) to large outdoor insulators. They can also serve as the binder for filled industrial floorings or as the matrix for fiber-reinforced plastics (FRP) used in the manufacture of items such as pressure pipes and tanks, rocket motor casings, and aerospace structural components. They can also be used as adhesives for major structural joints in the aerospace, automotive, and construction industries.

In order to demonstrate the various aspects of the invention the following experiments were performed:

EXAMPLE 1

1200 grams of a commercial, aliphatic polyamine epoxy resin hardener [Jeffco 3102, supplied by Jeffco Products, San Diego, Calif.] were added to a 2 liter round bottom flask and heated to 110° C. with constant stirring. To this polyamine was added 300.0 grams of a commercial polysilazane [KION® ML85, supplied by Kion Corporation, 150 East 58th Street, New York, N.Y. 10155, prepared by the coammonolysis of methyldichlorosilane and dimethyldichlorosilane] by dropwise addition to the reaction vessel. The rate of addition was controlled to prevent excessive gas evolution. After complete addition of the polysilazane, the reaction mixture was then stirred at 110° C. for 2 hours. Heat was then removed and the polysilazane-modified polyamine reaction product allowed to cool to room temperature.

EXAMPLE 2

160.6 grams of KION® ML85 polysilazane were mixed with 642.2 grams of a commercial, aliphatic polyamine epoxy resin hardener [Jeffco 3102, as described above] in a 2 liter round bottom flask. The mixture was stirred overnight at room temperature. Extensive gas evolution was observed. The mixture was then gradually heated to 92° C. with constant stirring. After 2 hours, gas evolution from the reaction mixture ceased, and the reaction product was allowed to cool to room temperature. After cooling, the product was placed under oil pump vacuum to remove any dissolved ammonia gas. When gas evolution ceased, the polysilazane-modified polyamine reaction product was placed in a screw-cap glass bottle and labeled for storage.

EXAMPLE 3

200.03 grams of an aliphatic polyamine epoxy resin hardener [Jeffco 3110] were mixed with 66.68 grams of KION® ML85 polysilazane in a 2 liter round bottom flask. The reaction mixture was stirred at room temperature until all off-gasing had subsided. The reaction mixture was then heated to 110° C. for 2 hours. At this temperature it was observed that some of the polyamine hardener was evaporating from the reaction flask. After the two hour period, the reaction mixture was then allowed to cool to room temperature, and the polysilazane-modified polyamine reaction product was placed in a screw-cap glass bottle and labeled for storage.

EXAMPLE 4

200.23 grams of a cycloaliphatic polyamine epoxy resin hardener [Jeffco 3163] were mixed with 66.74 grams of KION® ML85 polysilazane in a 2 liter round bottom flask. The mixture was stirred overnight at room temperature. Extensive gas evolution was observed. The mixture was then gradually heated to 95° C. with constant stirring. After 2 hours gas evolution from the reaction mixture ceased, and the reaction product was allowed to cool to room temperature. After cooling, the product was placed under oil pump vacuum to remove any dissolved ammonia gas. When gas evolution ceased, the polysilazane-modified polyamine reaction product was placed in a screw-cap glass bottle and labeled for storage.

EXAMPLE 5

10.24 grams of Jeffco 3102 aliphatic polyamine epoxy resin hardener and 2.81 grams of KION CERASET® poly(urea)silazane were added to a 100 ml round bottom flask. The mixture was then heated to 110° C. with vigorous stirring for a period of 1 hour, after which gas evolution was observed to cease. Heating was then discontinued and the poly(urea)silazane-modified polyamine reaction product was allowed to cool to room temperature.

EXAMPLE 6–13

12.0 grams of EPON® 828 epoxy resin (supplied by Resolution Performance Products, P.O. Box 4500, Houston, Tex. 77210), comprising the diglycidyl ether of bisphenol-A, were mixed with 3.0 grams of Jeffco 3102 aliphatic polyamine epoxy resin hardener (supplied by Jeffco Products, 5252 Kearny villa Way, San Diego, Calif. 92123). 1 gram aliquots of the mixture were separately applied to eight (8) metal coupons as follows: 1 brass coupon, 1 aluminum coupon, and 6 mild steel coupons. The aliquots on the brass coupon, the aluminum coupon, and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was then cast into a 2 inch diameter mold. All samples were allowed to cure at room temperature for a period of 8 hours.

A hard, transparent structural casting was obtained from the resin which was cured in the 2 inch diameter mold.

Clear, nearly colorless, adherant coatings were obtained for all coated samples.

One of the coated mild steel coupons and one of the adhesively bonded mild steel coupon samples were heated at 200° C. for 12 hours in an air oven. Significant degradation of the coating and the adhesive joint were noted.

Another of the coated mild steel coupons was heated at 500° C. for 2 hours in an air oven. The coating had blackened, was severely blistered and was spalling from the substrate.

Yet another of the coated mild steel coupons, as well as the coated brass and coated aluminum coupons were subjected to crosshatch adhesion testing. 76% of the crosshatched coating was retained on the mild steel coupon, 24% of the crosshatched coating was retained on the aluminum coupon, and 32% of the crosshatched coating was retained on the brass coupon.

The adhesively bonded mild steel coupon sample could be pulled apart with some difficulty.

EXAMPLE 14–21

12.0 grams of EPON® 828 epoxy resin were mixed with 4.0 grams of the polysilazane-modified Jeffco 3102 epoxy resin hardener prepared in Example 1. 1 gram aliquots of the mixture were separately applied to eight metal coupons as follows: 1 brass coupon, 1 aluminum coupon, and 6 mild steel coupons. The aliquots on the brass coupon, the aluminum coupon, and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 8 hours.

A hard, transparent casting was obtained from the resin which was cured in the 2 inch diameter mold.

Clear, nearly colorless, adherant coatings were obtained from all coated samples.

One of the coated mild steel coupons and one of the adhesively bonded mild steel coupon samples were heated at 200° C. for 12 hours in an air oven. Only minor degradation of the coating and the adhesive joint were noted.

Another of the coated mild steel coupons was heated at 500° C. for 2 hours in an air oven. The coating had blackened, but had neither blistered nor spalled form the substrate at all.

Yet another of the coated mild steel coupons, as well as the coated brass and coated aluminum coupons were subjected to crosshatch adhesion testing. 100% of the crosshatched coating was retained on the mild steel coupon, 40% of the crosshatched coating was retained on the aluminum coupon, and 100% of the crosshatched coating was retained on the brass coupon.

The adhesively bonded mild steel coupon sample could not be pulled apart.

EXAMPLES 22–29

12.0 grams of Jeffco 1337 epoxy resin, comprising the hydrogenated diglycidyl ether of bisphenol-A, were mixed with 3.0 grams of Jeffco 3102 aliphatic polyamine epoxy resin hardener. 1 gram aliquots of the mixture were separately applied to eight metal coupons as follows: 1 brass coupon, 1 aluminum coupon, and 6 mild steel coupons. The aliquots on the brass coupon, the aluminum coupon, and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 8 hours.

A hard, transparent structural casting was obtained from the resin which was cured in the 2 inch diameter mold.

Clear, nearly colorless, adherant coatings were obtained from all coated samples. One of the coated mild steel coupons and one of the adhesively bonded mild steel coupon samples were heated at 200° C. for 12 hours in an air oven. Significant degradation of the coating and the adhesive joint were noted.

Another of the coated mild steel coupons was heated at 500° C. for 2 hours in an air oven. The coating had blackened, was severely blistered and was spalling from the substrate.

Yet another of the coated mild steel coupons, as well as the coated brass and coated aluminum coupons were subjected to crosshatch adhesion testing. 52% of the crosshatched coating was retained on the mild steel coupon, 84% of the crosshatched coating was retained on the aluminum coupon, and 8% of the crosshatched coating was retained on the brass coupon.

The adhesively bonded mild steel coupon sample could be easily pulled apart.

EXAMPLES 30–37

12.0 grams of Jeffco 1337 epoxy resin, comprising the hydrogenated diglycidyl ether of bisphenol-A, were mixed with 4.0 grams of the polysilazane-modified Jeffco 3102 epoxy resin hardener prepared in Example 1. 1 gram aliquots of the mixture were separately applied to eight metal coupons as follows: 1 brass coupon, 1 aluminum coupon, and 6 mild steel coupons. The aliquots on the brass coupon, the aluminum coupon, and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 8 hours.

A hard, transparent structural casting was obtained from the resin which was cured in the 2 inch diameter mold.

Clear, nearly colorless, adherant coatings were obtained from all coated samples.

One of the coated mild steel coupons and one of the adhesively bonded mild steel coupon samples were heated at 200° C. for 12 hours in an air oven. Only minor degradation of the coating and the adhesive join were noted.

Another of the coated mild steel coupons was heated at 500° C. for 2 hours in an air oven. The coating had blackened, but had neither blistered nor spalled from the substrate at all.

Yet another of the coated mild steel coupons, as well as the coated brass and coated aluminum. The coupons were subjected to crosshatch adhesion testing. 100% of the crosshatched coating was retained on the mild steel coupon, 56% of the crosshatched coating was retained on the aluminum coupon, and 100% of the crosshatched coting was retained on the brass coupon.

The adhesively bonded mild steel coupon sample could be pulled apart with difficulty.

EXAMPLES 38–45

12.0 grams of EPON® 828 epoxy resin, comprising the diglycidyl ether of bisphenol-A, were mixed with 3.0 grams of Jeffco 3163 cycloaliphatic polyamine epoxy resin hardener. 1 gram aliquots of the mixture were separately applied to eight metal coupons as follows: 1 brass coupon, 1 aluminum coupon, and 6 mild steel coupons. The aliquots on the brass coupon, the aluminum coupon, and 4 of the mold steel coupons were drawn down to a 1 mil coating thickness.

The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 24 hours.

A hard, transparent structural casting was obtained from the resin which was cured in the 2 inch diameter mold.

Clear, nearly colorless, adherant coatings were obtained from all coated samples.

One of the coated mild steel coupons and one of the adhesively bonded mild steel coupon samples were heated at 200° C. for 12 hours in an air oven. Significant degradation of the coating and the adhesive join were noted.

Another of the coated mild steel coupons was heated 500° C. for 2 hours in an air oven. The coating had blackened, was severely blistered and was spalling from the substrate.

The adhesively bonded mild steel coupon sample could be pulled apart with difficulty.

EXAMPLES 46–53

12.0 grams of EPON® 828 epoxy resin, comprising the diglycidyl ether of bisphenol-A, were mixed with 4.0 grams of the polysilazane-modified Jeffco 3163 cycloaliphatic polyamine epoxy resin hardener prepared in Example 4. 1 gram aliquots of the mixture were separately applied to eight metal coupons as follows: 1 brass coupon, 1 aluminum coupon, and 6 mild steel coupons. The aliquots on the brass coupon, the aluminum coupon, and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 24 hours.

A hard, transparent structural coasting was obtained from the resin which was cured in the 2 inch diameter mold.

Clear, nearly colorless, adherant coatings were obtained from all coated samples.

One of the coated mild steel coupons and one of the adhesively bonded mild steel coupon samples were heated at 200° C. for 12 hours in an air oven. Only minor degradation of the coating and the adhesive joint were noted.

Another of the coated mild steel coupons was heated at 500° C. for 2 hours in an air oven. The coating had blackened, but had neither blistered nor spalled from the substrate at all.

The adhesively bonded mild steel coupon sampled could not be pulled apart.

EXAMPLES 54–61

12.0 grams of Jeffco 1337 epoxy resin, comprising the hydrogenated diglycidyl ether of bisphenol-A, were mixed with 3.0 grams of Jeffco 3163 cycloaliphatic polyamine epoxy resin hardener. 1 gram aliquots of the mixture were separately applied to eight metal coupons as follows: 1 brass coupon, 1 aluminum coupon, and 6 mild steel coupons. The aliquots on the brass coupon, the aluminum coupon and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 24 hours.

A hard, transparent casting was obtained from the resin which was cured in the 2 inch diameter mold.

Clear, nearly colorless, adherant coatings were obtained from all coated samples.

One of the coated mild steel coupons and one of the adhesively bonded mild steel coupon samples were heated at 200° C. for 12 hours in an air oven. Significant degradation of the coating and the adhesive joint were noted.

Another of the coated mild steel coupons was heated at 500° C. for 2 hours in an air oven. The coating had blackened, was severely blistered and was spalling from the substrate.

EXAMPLES 62–69

12.0 grams of Jeffco 1337 epoxy resin, comprising the hydrogenated diglycidyl ether of bisphenol-A, were mixed with 4.0 grams of the polysilazane-modified Jeffco 3163 cycloaliphatic polyamine epoxy resin hardener prepared in Example 4. 1 gram aliquots of the mixture were separately applied to eight metal coupons as follows: 1 brass coupon, 1 aluminum coupon, and 6 mild steel coupons. The aliquots on the brass coupon, the aluminum coupon, and 4 of the mild steel coupons were drawn down to a 1 mil coating thickness. The aliquots on the remaining 2 mild steel coupons were used as an adhesive to join an additional mild steel coupon to the two, already-treated mild steel coupons. Residual epoxy resin/hardener mixture was cast into a 2 inch diameter mold. All samples were allowed to cure at room temperature for a period of 24 hours.

A hard, transparent structural casting was obtained from the resin which was cured in the 2 inch diameter mold.

Clear, nearly colorless, adherant coatings were obtained from all coated samples.

One of the coated mild steel coupons and one of the adhesively bonded mild steel coupon samples were heated at 200° C. for 12 hours in an air oven. Only minor degradation of the coating and the adhesive joint were noted.

Another of the coated mild steel coupons was heated at 500° C. for 2 hours in an air oven. The coating had blackened, but had neither blistered nor spalled from the substrate at all.

I claim:

1. An epoxy resin hardener comprising a polysilazane-modified polyamine prepared from a reaction mixture consisting essentially of a polysilazane and a polyamine.

2. The epoxy resin hardener of claim 1, wherein the polysilazane moiety of said polysilazane-modified polyamine comprises repeating units of silicon-nitrogen linkages and comprises a reduced amount of silicon-hydrogen bonds relative to the quantity of silicon-hydrogen bonds in a halosilane compound used to prepare said polysilazane.

3. The epoxy resin hardener of claim 1, wherein the polysilazane used to prepare said polysilazane-modified polyamine comprises a reduced amount of silicon-hydrogen bonds relative to the quantity of silicon-hydrogen bonds incorporated into the polysilazane from a starting compound comprising at least one silicon-hydrogen bond and at least one silicon-halide bond, said polysilazane further comprising a greater number of silicon-nitrogen bonds and a greater nitrogen content than would otherwise be derived from complete ammonolysis of the silicon-halide bonds of said starting compound.

4. The epoxy resin hardener of claim 1, wherein the polysilazane-modified polyamine comprises at least one newly formed silicon-nitrogen bond.

5. The epoxy resin hardener of claim 1, wherein the polysilazane moiety of said polysilazane-modified polyamine is derived from a member selected from the group consisting of a polysilazane, a polysiloxazane, a poly(urea)silazane, a poly(thio)ureasilazane and a poly(boro)silazane.

6. The epoxy resin hardener of claim 1, wherein the polyamine comprises primary amine groups.

7. The epoxy resin hardener of claim 1, wherein the polyamine comprises secondary amine groups.

8. The epoxy resin hardener of claim 1, wherein the polyamine is a compound selected from the group consisting of ethylene diamine, diethylene triamine and triethylene tetramine.

9. A reaction product comprising a polyamine and a polysilazane comprising at least one newly formed silicon-nitrogen bond, said reaction product prepared from a reaction mixture consisting essentially of a polysilazane and a polyamine.

10. The reaction product of claim 9, wherein the ratio of the number of amine groups from the polyamine reactant in the unreacted composition to the number of silicon-nitrogen bonds from the polysilazane reactant is greater than or equal to 1.

11. The reaction product of claim 9, wherein the ratio of the number of amine groups from the polyamine reactant in the unreacted composition to the number of silicon-nitrogen bonds from the polysilazane reactant is from about 2 to about 6.

12. The reaction product of claim 9, wherein the ratio of the number of said amine groups from the polyamine reactant in the unreacted composition to the number of silicon-nitrogen bonds from the polysilazane reactant is from about 3 to about 5.

13. A reaction mixture consisting essentially of a polyamine and a polysilazane.

14. The reaction mixture of claim 13, wherein the ratio of the number of amine groups from said polyamine reactant in the unreacted composition to the number of silicon-nitrogen bonds from said polysilazane reactant is greater than or equal to 1.

15. The reaction mixture of claim 13, wherein the ratio of the number of amine groups from said polyamine reactant in the unreacted composition to the number of silicon-nitrogen bonds from said polysilazane reactant is from about 2 to about 6.

16. The reaction mixture of claim 13, wherein the ratio of the number of organic amine groups from said polyamine reactant in the unreacted composition to the number of silicon-nitrogen bonds from said polysilazane reactant is from about 3 to about 5.

17. A composition for hardening an epoxy resin comprising the epoxy resin hardener of claim 1.

18. A composition for hardening an epoxy resin comprising the epoxy resin hardener of claim 2.

19. A composition for hardening an epoxy resin comprising the epoxy resin hardener derived from a polysilazane according to claim 5.

20. A composition for hardening an epoxy resin comprising the epoxy resin hardener derived from a polyamine according to claim 8.

21. A composition for hardening an epoxy resin comprising a reaction product according to claim 9.

22. A reaction mixture comprising a polysilazane-modified polyamine hardener and an epoxy resin.

23. The reaction mixture of claim 22, wherein the epoxy resin comprises a resin which is a member selected from the group consisting of a diglycidyl ether of Bisphenol A (DGEBA), a tetraglycidyl methylene dianiline (TGMDA), a polynuclear phenol epoxy (PNP), an epoxy phenol novolac, an epoxy cresol novolac, cycloaliphatic epoxies (CA) and a hydantoin epoxy (HY).

24. The reaction mixture of claim 22, wherein the epoxy resin comprises a diglycidyl ether of Bisphenol A (DGEBA).

25. A reaction mixture comprising the reaction product of a polyamine and a polysilazane comprising at least one newly formed silicon-nitrogen bond and an epoxy resin.

26. The reaction mixture of claim 25 wherein, the epoxy resin comprises a resin which is a member selected from the group consisting of a diglycidyl ether of Bisphenol A (DGEBA), a tetraglycidyl methylene dianiline (TGMDA), a polynuclear phenol epoxy (PNP), an epoxy phenol novolac, an epoxy cresol novolac, cycloaliphatic epoxies (CA) and a hydantoin epoxy (HY).

27. The reaction mixture of claim 25, wherein the epoxy resin comprises a diglycidyl ether of Bisphenol A (DGEBA).

28. A reaction mixture comprising a polysilazane-modified polyamine hardener and an epoxy resin, wherein the polysilazane moiety of said polysilazane-modified polyamine comprises repeating units of silicon-nitrogen linkages and a reduced amount of silicon-hydrogen bonds relative to the quantity of silicon-hydrogen bonds in a halosilane compound used to prepare said polysilazane.

29. A reaction product prepared from the reaction mixture of claim 22.

30. A reaction product prepared from the reaction mixture of claim 23.

31. A reaction product prepared from the reaction mixture of claim 24.

32. A coating comprising the reaction product of claim 29.

33. An adhesive comprising the reaction product of claim 29.

34. A structural material which comprises the reaction product of claim 29.

* * * * *